United States Patent [19]
Schreiber et al.

[11] Patent Number: 5,227,588
[45] Date of Patent: Jul. 13, 1993

[54] INTERCONNECTION OF OPPOSITE SIDES OF A CIRCUIT BOARD

[75] Inventors: Christopher M. Schreiber, Newport Beach; Wiliam R. Crumly, Anaheim; Robert B. Hanley, Santa Ana, all of Calif.

[73] Assignee: Hughes Aircraft Company, Los Angeles, Calif.

[21] Appl. No.: 674,254

[22] Filed: Mar. 25, 1991

[51] Int. Cl.⁵ .............................. H05K 1/00
[52] U.S. Cl. .................... 174/262; 174/265; 428/901; 29/852; 29/846
[58] Field of Search ............... 174/262, 265, 266, 267, 174/264, 254; 29/846, 852, 830, 850; 361/412, 414; 428/901; 333/33

[56] References Cited

U.S. PATENT DOCUMENTS

| | | | |
|---|---|---|---|
| 3,077,511 | 2/1963 | Bohrer et al. | 174/265 |
| 3,148,310 | 9/1964 | Feldman | 174/265 |
| 3,350,498 | 10/1967 | Leeds | 174/264 |
| 3,471,631 | 10/1969 | Quintana | 174/264 |
| 3,953,924 | 5/1976 | Zachry et al. | 174/262 X |
| 3,971,610 | 7/1976 | Buchoff et al. | 174/262 |
| 4,238,527 | 12/1980 | Monnier et al. | 174/262 X |
| 4,563,543 | 1/1986 | Kersuzan et al. | 428/901 X |
| 4,646,436 | 3/1987 | Crowell et al. | 29/850 |
| 4,788,766 | 12/1988 | Burger et al. | 29/830 |
| 4,994,771 | 2/1991 | Takamine et al. | 333/33 |
| 5,032,694 | 7/1991 | Ishihara et al. | 174/264 X |
| 5,046,238 | 9/1991 | Daigle et al. | 361/412 X |

OTHER PUBLICATIONS

Lindenmeyer, Carl W. "Double Side Circuit Board and A Method for its Manufacture", US Statortory Invention Registration, No. H650, Jul. 4, 1989.

*Primary Examiner*—Leo P. Picard
*Assistant Examiner*—Trinidad Korka
*Attorney, Agent, or Firm*—Elizabeth E. Leitereg; Terje Gudmestad; Wanda K. Denson-Low

[57] ABSTRACT

A circuit board comprising a dielectric composite (20,22,24) clad with electrical circuitry (16,38) is provided with an improved electrical interconnection between alternate conductive circuitry planes of the substrate. Connecting features (18,40) integral with the conductive circuitry on each conductive plane of the substrate extend into a through hole (30) of the substrate toward each other and are fused (46) to one another by irradiation from a laser beam. In another embodiment a connecting feature (52) from only one of the circuit layers (50) extends into the through hole (66) of the dielectric (60,62,64) and is electrically connected and physically bonded to the circuitry layer on the other side of the substrate by means of fusion or a drop (68) of electrically conductive resin interposed between the raised connector feature and the opposed circuit layer (74). The resin is applied and semi-cured to a "B"-stage, and then the conductive circuit layers and dielectric are laminated together under heat and pressure to form the substrate. The resin flows into the dielectric hole and over and around the connective feature and thereby providing contact with the circuitry layer of the opposing side. Thereafter the resin is cured to form a strong mechanical and electrical contact.

24 Claims, 4 Drawing Sheets

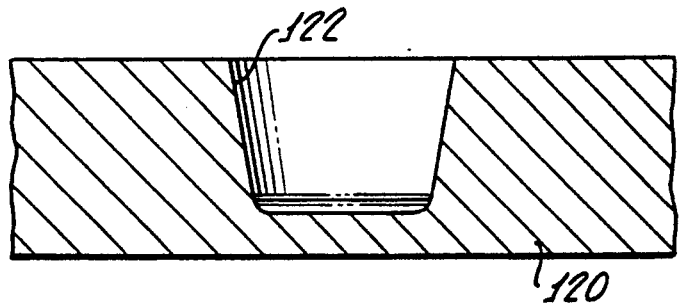
_FIG. 11._
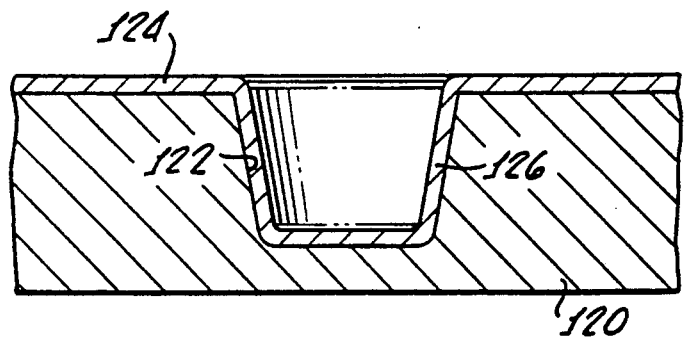
_FIG. 12._
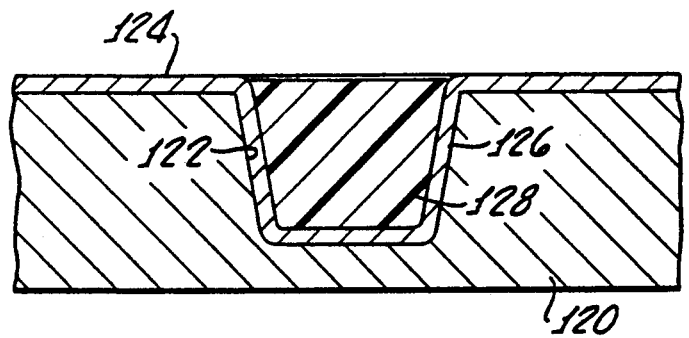
_FIG. 13._
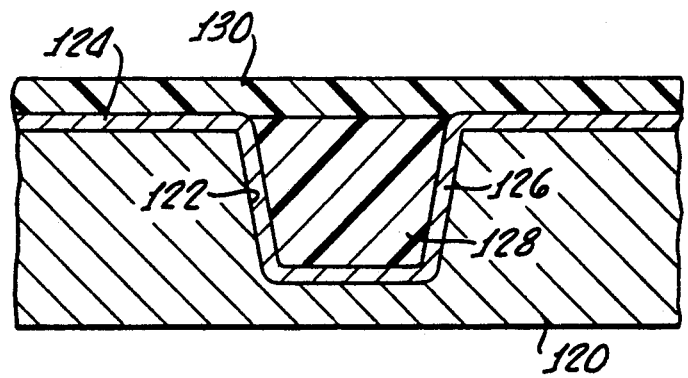
_FIG. 14._

INTERCONNECTION OF OPPOSITE SIDES OF A CIRCUIT BOARD

BACKGROUND OF THE INVENTION

1. Field of the Invention

The present invention relates to manufacture of electrical circuitry and more particularly concerns manufacture of electrical circuitry having multiple conductive circuit layers interposed within a dielectric substrate, which conductive layers are interconnected to one another through the substrate.

2. Description of Related Art

As electrical printed circuits are packaged in ever smaller volumes, density of circuit components increases, and it is common to form a single dielectric substrate with layers of circuitry on both of its sides and, further, to form stacks of such substrates and circuitry. Circuit layers on the two sides of a dielectric substrate are frequently connected to each other through a hole in the substrate to form a through hole connection. One common method of forming a through hole connection comprises initially plating the electrically non-conductive sides of the hole with an electroless copper or nickel copper coating, and thereafter electrolytically plating the hole so as to provide a continuous electrically conductive plating or coating through the hole from a pad on one side of the dielectric substrate to a pad on the other. Electroless plating is a laborious, time consuming process, frequently requiring from seven to twelve different tanks of solutions and rigid process controls.

Through hole technology requires drilling holes through the dielectric substrate to pads on both sides that are to be connected by the electroless and electrolytic plating. In manufacture of a stack of circuit boards, this method wastes valuable areas on the layers that are not necessarily involved in the connection, since the holes must be drilled through all layers of a stack of several circuit boards and not just through layers to be connected. An alternative method of interconnecting layers of a board in a stack of boards involves the use of buried vias which extend only through a single board of a stack of boards, for example, and connecting only specific layers desired. But this procedure requires sequential lamination of the several boards, reduces yield and increases costs by more than one order of magnitude.

Not only does the use of plating techniques require rigid controls on a great many chemical baths, but the process generates undesired and hazardous effluents. Thus, special handling of hazardous chemicals is required. Techniques for disposal of resulting hazardous effluents are complex and expensive and subject to strict government controls.

Accordingly, it is an object of the present invention to provide circuit layer interconnections that avoid or minimize above mentioned problems.

SUMMARY OF THE INVENTION

In carrying out principles of the present invention in accordance with a preferred embodiment thereof, a multi-layered circuit board having a dielectric substrate with first and second circuit layers on opposite sides thereof is manufactured by forming the substrate with a hole and forming a first one of the circuit layers with a three-dimensional or raised connection feature. The two circuit layers and substrate are then laminated together with the layers on either side of the substrate and with the raised feature projecting through a hole in the dielectric. Then the raised feature is electrically interconnected to the other circuit layer. According to one specific embodiment the raised feature is connected to the second circuit layer by a second raised interconnection feature formed on the second layer and also extending into the substrate hole, but from the other side. The electrical interconnection between the two circuit layers on opposite sides of the substrate is then completed by interconnecting the two raised features, which is done by fusing the two together with the heat of a laser beam. Alternatively, the first raised feature extends entirely through the hole to the other circuit layer to which it is fused.

In a further embodiment the interconnection of the raised feature of the first layer to the second layer is performed by putting an electrically conductive resin on the portion of the raised feature extending into the hole of the dielectric substrate before laminating the second layer to the substrate. The resin is then caused to flow and thereafter cured to electrically and physically interconnect the raised feature to the second layer.

BRIEF DESCRIPTION OF THE DRAWINGS

In the accompanying drawings:

FIG. 11 illustrates portions of a modified form of mandrel on which a circuit layer is formed;

FIG. 12 illustrates the formation of a circuit layer on the mandrel of FIG. 11;

FIG. 13 illustrates the filling of the raised feature of FIG. 12 with an epoxy;

FIG. 14 illustrates the application of a dielectric substrate;

DESCRIPTION OF THE PREFERRED EMBODIMENTS

In the disclosed embodiments of the present invention a dielectric substrate of a double sided circuit board is clad with two circuit layers, one on each side of the substrate, with at least one of the circuit layers having a three-dimensional connection feature that extends out of the plane of the circuit and into or through a hole in the dielectric to extend from one side of the substrate toward the other. The three-dimensional interconnection feature may be formed on one or more circuit layers by many different processes. However, at present it is preferred to form the three-dimensional connection feature as an integral part of a circuit layer, employing techniques described in the co-pending application of William R. Crumly, Christopher M. Schreiber, and Heim Feigenbaum for Three Dimensional Electroformed Circuitry, Ser. No. 580,758, filed Sep. 11, 1990. This co-pending application for Three Dimensional Electroformed Circuitry is assigned to the assignee of the present application, and the disclosure of the prior application is incorporated in the present application by this reference as though fully set forth herein.

Briefly, as described in full and complete detail in the earlier filed application, a printed circuit is formed with circuit traces lying in a single plane, generally but not necessarily planar, which circuitry is provided with three-dimensional features projecting from the surface in one or more directions. Importantly, the projecting features and circuitry are all formed by additive processes, such as electrolytic plating, electroless plating, electrophoretic or electrostatic coating, or other forms of electroforming or electrodeposition of conductive metal. No etching is employed in the manufacture of the circuit, making it an environmentally safe process. The circuit is manufactured by using a mandrel having a working surface formed of a material that can have conductive circuitry electroformed thereon and which has a pattern of a material that is resistant to the electroforming process. The mandrel itself has three-dimensional features projecting from its working surface, which features may project in different directions. For purposes of the present invention, it may be noted that the projecting features include a post projecting outwardly of the working surface of the mandrel that enables production of an electrical circuit having an electroformed post or raised feature that projects from the surface of the circuitry. The projecting feature of the mandrel may also be formed as a depression in the mandrel which also enables production of a circuit layer with a raised feature. The mandrel and its projecting feature (post or depression) are electrically conductive so that the circuitry can be formed on the mandrel by electrolytic plating or other electroforming methods.

Figure 1:
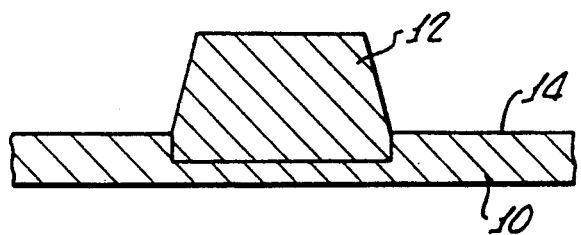
FIG. 1 illustrates portions of a mandrel on which a circuit layer is formed.
Figure 2:
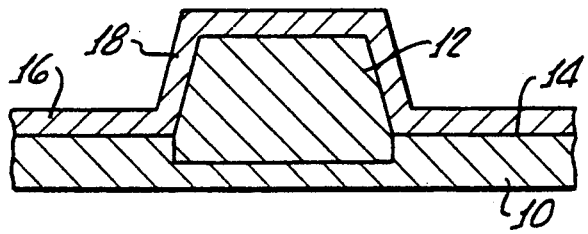
FIG. 2 illustrates a trace with raised feature formed on the mandrel.

FIG. 1 illustrates a section of a portion of such a mandrel, having a mandrel body 10 and a raised mandrel feature 12 projecting from the surface 14 of the mandrel. Conveniently the raised feature may be a pin fixed in a hole in the mandrel or otherwise firmly and physically connected to the mandrel. The use of a mandrel with a depression forming its projecting feature will be described below. The mandrel and its projecting feature are formed with an electrically conductive pattern on a surface thereof that defines configuration of the electrical circuit layer that is to be formed. The electroformed circuit is then deposited on the surface of the mandrel, as by electrolytic plating for example, to provide a first circuit layer 16, having a first integral raised or connection feature 18 that is formed over the projecting mandrel feature 12.

Figure 3:
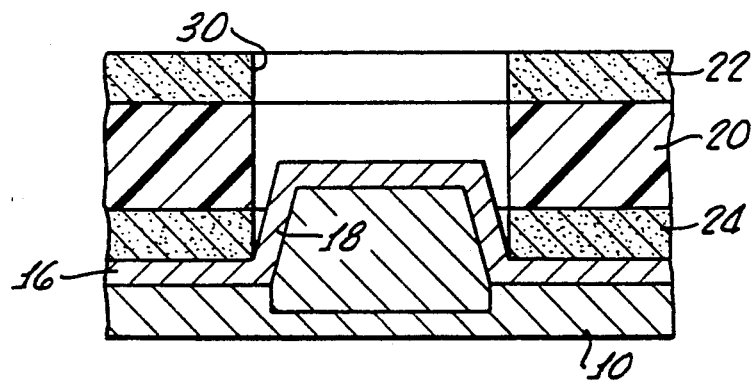
FIG. 3 shows the juxtaposition of a dielectric substrate to the circuit on the mandrel.

Having formed a first layer of the circuit with its projecting connection feature 18, a dielectric substrate is then assembled to the first circuit layer, as illustrated in FIG. 3. The dielectric substrate may comprise many different types of dielectric, and in a presently preferred arrangement incorporates a polyamide, such as Kapton 20 clad on both sides with a layer of acrylic adhesive 22,24. The Kapton may have a thickness of 2 to 3 mils, and each acrylic adhesive layer a thickness of about 1 mil for example. The substrate has a pre-drilled through hole 30 formed therein which receives the raised connecting feature 18 of the first circuit layer 16 when the latter is laminated to one side of the substrate. This procedure is performed preferably while the circuit layer is still on the mandrel 10, as the very thin circuit layer is more readily handled while still on the mandrel.

Figure 4:
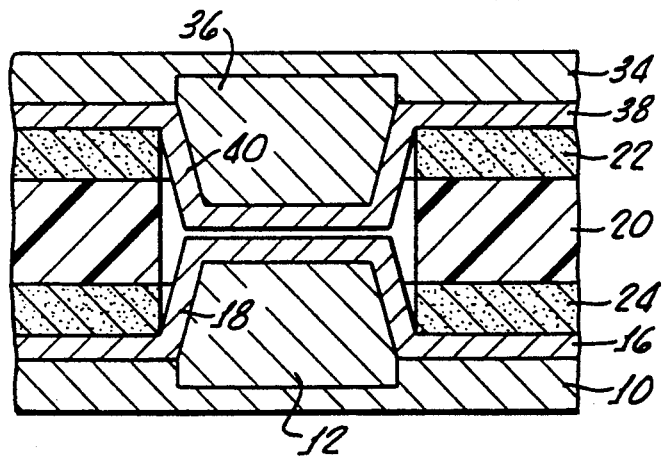
FIG. 4 shows the laminated assembly of a second circuit layer to the substrate and first circuit layer.

Employing an identical mandrel and raised feature, such as a second mandrel 34 having a raised mandrel feature 36 (see FIG. 4), a second circuit layer 38, having a second integral raised connection feature 40 is formed by the techniques described above. As previously described, the circuit layers are preferably formed by electrolytically plating the conductor material, such as copper, upon the electrically conductive mandrel and its raised feature. Each of the raised connecting features 18 and 40 of the first and second circuit layers 16 and 38 projects from the plane of its circuitry a distance substantially equal to one half of the thickness of the dielectric substrate so that when the two circuit layers are laminated to the dielectric substrate, one being secured to each side thereof (while the layers are still on the respective mandrels), the two raised features will contact one another or almost contact one another at a point about midway between the opposite sides of the dielectric substrate. This step in the assembly is illustrated in FIG. 4.

Figure 5:
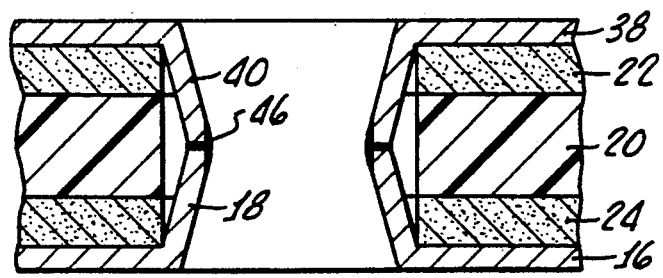
FIG. 5 shows the resulting fused interconnection of raised features created by laser irradiation.

After laminating the two raised connecting features 18 and 40 the two mandrels are then removed from the circuit layers. Next, the site is irradiated using a YAG laser operated at about 135 watts for example with a single 0.5 millisecond pulse providing an output power of about 3 joules. The single pulse of the laser is sufficient to melt and vaporize adjoining end portions of the two raised interconnection features and to weld them to one another at their periphery, forming a continuous circumferential weld fillet indicated at 46 in FIG. 5. The welding of the two raised connection features of course physically and electrically interconnects the two features, thereby providing through the core electrical connection between circuit layers 16 and 38, and also providing a mechanical interconnection of the two layers. The arrangement of FIG. 5 may be termed a fused alternate plane interconnection.

The described process is free of electroless plating and the many tanks of hazardous chemicals required in electroless processes. As the two circuit layers on opposite sides of the dielectric substrate may have a number of the described alternate plane interconnections, each layer is formed with a number of raised connection features formed in a pre-selected pattern, with the patterns of raised features of the circuit layers on either side being precisely congruent with one another so that they may be registered with each other, and registered with the identical pattern of through holes formed in the interposed dielectric substrate. The use of a laser to bond the two raised connection features together enables the use of smaller area interconnection features because the laser can be focused down to very minute areas.

It will be seen that the fused alternate plane interconnection method of FIGS. 1 through 5 employs a raised feature on one circuit layer on one side of the dielectric substrate, with the feature extending into the through hole of the substrate. This raised feature is then connected to the circuit layer on the other side of the substrate by means of a raised feature on the layer that is secured to the second substrate side.

Figure 6:
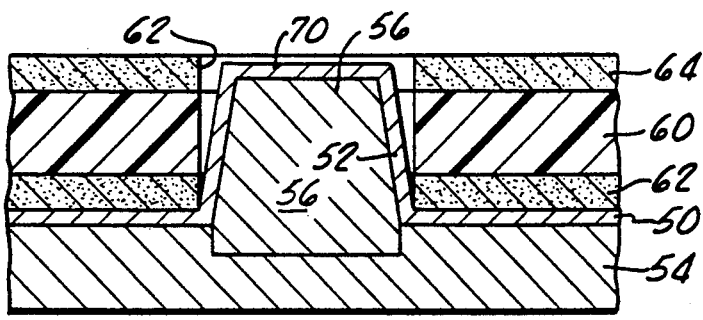
FIG. 6 illustrates partial assembly of a first circuit layer and dielectric substrate of a second embodiment of the invention.
Figure 7:
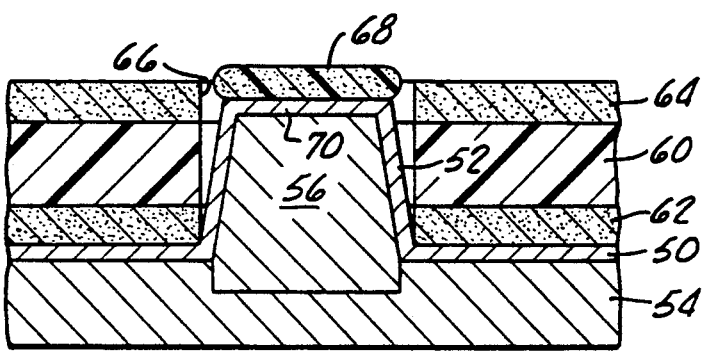
FIG. 7 shows the application of a conductive resin to the raised feature of FIG. 6.
Figure 8:
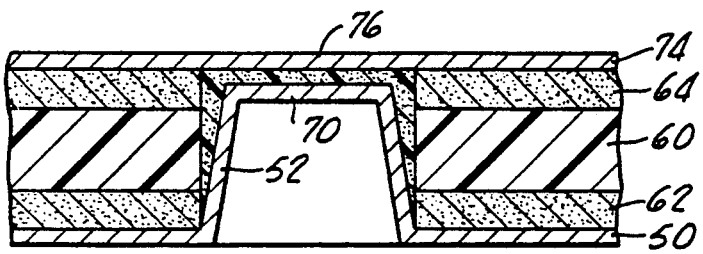
FIG. 8 shows the completed double sided circuit of the second embodiment with the two layers on opposite sides of the substrate interconnected through the dielectric substrate hole.

An alternate arrangement that provides a laminated buried via is illustrated in FIGS. 6 through 8. Interconnection between a raised feature of one circuit layer that extends into the through hole and the circuit layer on the second side of the substrate is provided by an electrically conductive epoxy. Thus, as illustrated in FIG. 6, a first circuit layer 50, having a raised interconnection feature 52, is formed on a mandrel 54, which has a raised mandrel feature 56 projecting therefrom. The formation of the circuit layer 50 and its raised feature 52 is just the same as the formation of each of the circuit layers and their raised features described above and illustrated in connection with FIGS. 1 through 5. A significant difference between the two, however, is in the dimensions of the raised interconnection feature as compared to the thickness of the substrate. The feature 56 extends almost completely through the substrate.

The layer 50 of the embodiment of FIG. 6 is to be laminated to a dielectric substrate which is identical to the substrate of the arrangement of FIGS. 1 through 5, and which comprises a layer of a dielectric material such as polyamide, or Kapton 60 clad on both sides with an acrylic adhesive 62 and 64. As can be seen in FIG. 6, the raised feature 52 of circuit layer 50 extends substantially completely through the hole 66 that is formed in the substrate, whereas in the arrangement of FIGS. 1 through 5 each of the two raised interconnection features extends substantially only half way through the hole of the interposed substrate.

After laminating the substrate to the layer 50 while the latter is still on its mandrel 54, a small quantity or a drop 68 (FIG. 7) of a metal laden resin, such as for example a silver or gold epoxy, is placed on the end 70 of the raised feature 52. The resin drop 68 may have a height of from 1 to 3 mils and preferably covers all or most of the upper end 70 of the raised feature 52, which itself may have a diameter of between 5 and 50 mils. The resin is allowed to partially cure to a B-stage by conventional methods, such as heating to about 250° F. for about thirty minutes. The resin may be applied to the end 70 of raised feature 52 either before or after the dielectric 60, 62, 64 is laminated to the circuit layer 50 and either before or after the raised feature is inserted into the dielectric hole 66. As previously described, there are a number of the raised features on the circuit 50, arranged in a predetermined pattern, and the dielectric substrate has a similar number of through holes arranged in a congruent registering pattern. The drops 68 of electrically conductive resin may be applied by various methods, such as by automatic liquid dispensers, silk screening or spraying using a suitable mask.

Now the second conductive circuit layer 74 is laminated to the other side of the dielectric substrate, as illustrated in FIG. 8. The second circuit layer need not have no raised feature, but does include conductive portion or pad 76 extending over the substrate hole and over the end 70 of the raised connection feature 52. The assembly of dielectric substrate, lower layer 50 and upper layer 74 is then laminated under heat and pressure so that the electrically conductive resin 68 flows over and around the raised connection feature 52 and into the spaces in the substrate between the raised feature and the walls of hole 66. The resin is then allowed to completely cure, thereby providing a rigid electrically conductive interconnection between the circuit layers 50 and 74 on opposite sides of the interposed dielectric substrate. The conductive resin flows into small pores in the metallic surface layers and thus achieves a strong intimate bond which provides not only physical adhesion but good electrical contact of this laminated buried via. Other circuit boards may be stacked with the board shown in FIG. 8 without being disturbed or processed to provide the buried via.

Figure 9:
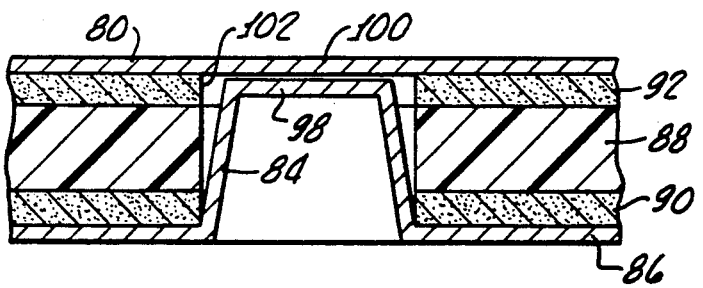
FIG. 9 illustrates a preliminary step in manufacture of a circuit board according to a third embodiment of the invention.
Figure 10:
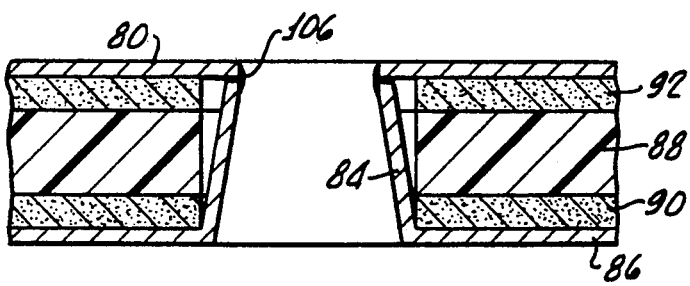
FIG. 10 illustrates the completed double sided circuit board of the third embodiment of the invention.

Illustrated in FIGS. 9 and 10 are various steps in a third embodiment of the present invention, forming a fused alternate plane interconnection. A circuit layer 80 (of copper or the like) on one side of a dielectric substrate 82 is fused to a raised interconnection feature 84 integrally formed with the lower (as viewed in FIG. 9) circuit layer 86 (also of copper or the like). In the arrangement of FIGS. 9 and 10 the first conductive circuit layer 86 is formed with its raised interconnection feature on a mandrel in the manner described above. The first layer and its raised interconnection features is then laminated to a dielectric substrate, again comprising a layer of dielectric material such as polyamide or Kapton 88 covered on both sides with an acrylic adhesive 90,92. In this arrangement the raised feature 84 projects from the plane of its circuit layer 86 for a distance substantially equal to the full thickness of the dielectric substrate so that the outer surface of the top 98 of the raised feature 84 is closely adjacent to or in contact with the second conductive circuit layer 80 when the latter is laminated to and against the second side of the substrate 82. In this arrangement, as in the other arrangements described herein, the circuit layers are adhesively bonded to the interposed dielectric substrate by means of the layers of acrylic adhesive on the polyamide core of the substrate.

Now with the top 98 of connection feature 84 closely adjacent the area 100 of conductive layer 80 that extends across the hole 102 in the substrate, a laser is employed as previously described in connection with FIGS. 1 through 5 to heat the adjoining portions 98,100 of the raised feature 84 and circuit layer 80, thereby melting and vaporizing an intermediate portion of these materials and welding them together at a continuous circumferential weld fillet 106, as illustrated in FIG. 10.

Although the drawings illustrate interconnection of conductive circuit layers on opposite sides of one interposed dielectric, it will be understood that such an assembly may provide only two or many more conductive circuit layers in a stack of many circuit layers and interposed dielectrics. In such a stack each conductive circuit layer may be connected to adjacent conductive circuit layers on both sides by the methods and arrangements described herein, so that more than two conductive circuit layers may all be electrically connected to one another.

As mentioned above, the raised feature of the mandrel may either be a depression or a post. The mandrel arrangement with a raised feature formed by a post has been described above. Illustrated in FIG. 11 is an alternative mandrel arrangement in which the raised feature of a mandrel 120 is formed by a depression 122 that is etched, burned or otherwise formed in the surface of the mandrel. This mandrel, as before, is made of an electrically conductive material, such as stainless steel, so that, as previously described, a conductive circuit layer 124, such as copper, may be selectively formed in a predetermined pattern over the mandrel surface by additive processes, such as, for example, electrolytic plating (FIG. 12). This forms a hollow raised feature 126. One advantage of the use of a depression rather than a post for the raised mandrel feature is the fact that while still on the mandrel the raised hollow feature 126 of the circuit layer may be filled with a hard supporting material, such as an epoxy 128 (FIG. 13). The latter is applied to the hollow interior of the raised feature 126 while the latter is still on the mandrel and is then allowed to cure. Now the substrate, generally indicated at 130 (FIG. 14), comprising, as previously described, a layer of Kapton clad on both sides with an acrylic adhesive, is bonded to the circuit layer 124 and to the cured epoxy fill 128, thus providing a stronger raised feature capable of withstanding greater stresses.

Figure 15:
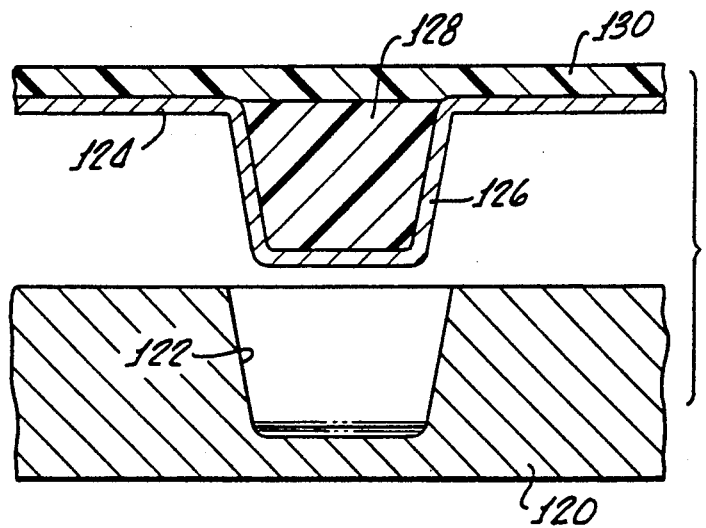
FIG. 15 illustrates removal of the substrate and circuit layer from the mandrel.
Figure 16:
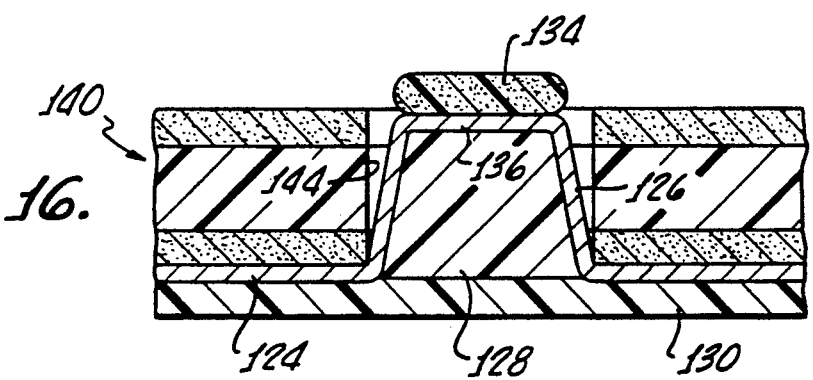
FIG. 16 illustrates the application of conductive epoxy.
Figure 17:
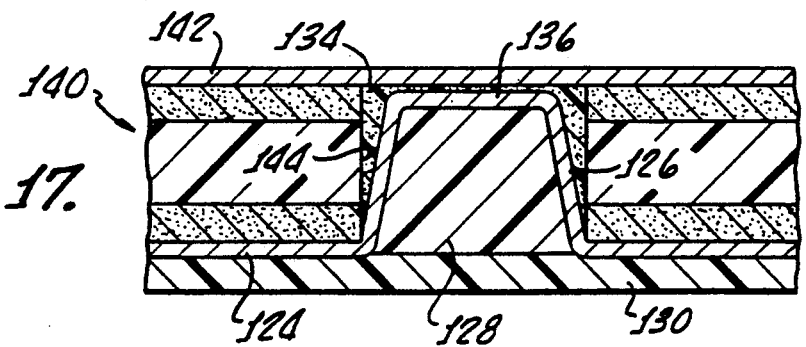
FIG. 17 illustrates the lamination of a second conductive circuit layer.

As illustrated in FIG. 15, after the substrate 130 is laminated to the circuit layer 124 and its reinforced raised feature 126, it is removed from the mandrel 120 and then a drop of a metal laden epoxy, such as silver epoxy 134 (FIG. 16), is applied to an upper portion 136 of the raised feature 126 of the circuit layer. As previously described in connection with FIGS. 6, 7 and 8, this epoxy is allowed to partially cure to a B-stage, and then, as illustrated in FIG. 16, it is assembled to a second dielectric substrate 140, which may also comprise a layer of Kapton clad on each side with an acrylic adhesive. Substrate 140 has a hole 144 therethrough which accepts the reinforced raised feature 126. An additional circuit layer 142 (FIG. 17) of a conductive material, such as copper, is then laminated to the dielectric layer 140, covering the latter and the epoxy 134. Then, in the same manner as is described in connection with FIGS. 7 and 8, the assembly of dielectric substrates 130,140, lower circuit layer 124, upper circuit layer 142 is laminated under heat and pressure so that the electrically conductive resin 134 flows over and around the raised connection feature 126 and into the spaces in the substrate between the raised feature and the walls of the hole 144 formed in the substrate 140. The resin, as before, is then allowed to completely cure, thereby providing a rigid electrically conductive interconnection. Thus, in this arrangement, a reinforced buried via interconnects the circuit layers 124 and 142 on opposite sides of the dielectric substrate.

The mandrel 120 illustrated in FIGS. 11 through 15, having its hollow raised feature defined by the depression 122, may be employed in the place of the mandrel having a pin or post forming its raised features in the manufacture of any one of the embodiments described herein. Thus all of the embodiments described herein may employ a mandrel of either type, namely that with a raised feature formed by a post or that with a raised feature formed by a depression. It is presently preferred to form the raised features by plating into a depression in the mandrel and then filling the hollow feature with epoxy, although the plating over a post or pin on the mandrel is a satisfactory alternative.

The drawings illustrate some of the many methods for making a through hole connection using a raised feature that extends into or through a hole in the substrate. The described methods produce either fused alternate plane interconnections or laminated buried vias. Other methods may be employed without departing from principles of this invention. For example, one such alternate method is illustrated in the above-identified co-pending patent application wherein a silver epoxy ground plane is painted on the second side of the substrate to contact a raised feature extending from the first substrate side.

There have been described circuit boards and methods for their manufacture which provide through hole interconnection between circuitry on both sides of an interposed dielectric substrate without use of any electroless plating processes. The arrangements employ a raised connection feature integral with the circuit layer on one side of the substrate which extends at least partly into a hole of the substrate and is electrically connected to the circuit layer on the other side. The electrical connection to the circuit layer on the other side may be made by means of a second raised connection feature integral with the circuit layer on the second side of the substrate which is welded to the raised interconnection feature of the first layer at a point within the substrate hole. Alternatively, the electrical connection between the raised feature and the circuit layer on the second side may be made by configuring the raised feature to extend completely through the hole to the circuit layer on the second side and welding the two at that point. In still another arrangement the electrical connection between a raised feature, which extends substantially entirely through the hole of the dielectric substrate, and the circuit layer on the other side is made by interposing electrically conductive resin which is caused to flow under heat and pressure to effectively fill all of the space between the raised interconnection feature and the second circuit layer and to flow down into the hole in the space between the raised interconnection feature and the substrate. The described arrangements are relatively simple, rapid and have been found to result in highly reliable interconnections.

What is claimed is:

1. A method of making a multi-layered circuit board having a dielectric layer with first and second conductive circuit layers on opposite sides thereof interconnected with one another through said dielectric layer, said method comprising the steps of:

forming a dielectric layer having a hole therethrough, forming a first conductive circuit layer having a first raised feature, forming a second conductive circuit layer, placing an electrically conductive organic resin on an end of said first raised feature, laminating said first conductive layer, second conductive layer and said dielectric layer together with said dielectric layer between said first and said second conductive layers and with said first raised feature extending into said hole, and electrically connecting said first raised feature to said second conductive layer comprising causing said resin to flow between said first raised feature and said second circuit layer and curing said resin therebetween.

2. The method of claim 1 wherein the step of placing an electrically conductive organic resin includes interposing a partially cured electrically conductive epoxy between said raised feature and said second layer, and wherein said step of electrically connecting comprises subjecting said laminated layers and said partially cured epoxy to heat and pressure, thereby causing said partially cured epoxy to flow between said second layer and said first raised feature, and curing said epoxy.

3. The method of claim 1 wherein said second layer is formed with a second raised feature, said step of laminating comprising extending both said first and second raised features into said hole from opposite sides of said dielectric layer, said step of electrically connecting comprising connecting said first feature and said second feature to each other with said electrically conductive organic resin.

4. The method of claim 1 wherein said step of forming a first layer comprises:
   providing a mandrel having an electrically conductive surface that defines a configuration of an electrical circuit and having at least one electrically conductive mandrel feature projecting from said surface, and
   electrodepositing said first circuit layer on said mandrel and said mandrel feature to define a three-dimensional electrically conductive circuit layer having an integrally formed said first raised feature projecting therefrom.

5. The method of claim 4 wherein said mandrel feature projects outwardly of said mandrel surface and wherein said step of laminating is performed while said first layer is on said mandrel.

6. The method of claim 4 wherein said mandrel feature is a depression projecting inwardly of said mandrel surface and the step of forming a first circuit layer further comprises the step of removing said first circuit layer from said mandrel before said step of laminating, such that said raised feature on said first layer projects outwardly from said removed first circuit layer.

7. The method of claim 6 wherein said raised feature is hollow and the step of forming a first circuit layer further comprises the step of filling said hollow raised feature with a solid material before said step of removing.

8. A circuit board made by the method of claim 7.

9. A multi-layer circuit board comprising:
   a dielectric layer having first and second sides and having a hole extending therethrough,
   a first layer of electrically conductive material at said first side having an electrically conductive connection feature extending at least partly into said hole, said first layer and said connection feature comprising an electrolytically deposited circuit and an electrolytically deposited feature raised from said circuit that is formed simultaneously and integrally with said circuit,
   a second layer of electrically conductive material at said second side, and
   electrically conductive connector means secured to said second layer and extending into said hole in electrical contact with said connection feature, said electrically conductive connector means comprising an electrically conductive organic resin interposed between said second side and said connection feature and extending into said hole over and around said connection feature of said first layer.

10. The circuit board of claim 9 wherein said connector means comprises an electrically conductive resin interposed between said second side and said connection feature and having a portion extending into said hole over and around said connection feature of said first layer.

11. The circuit board of claim 9 wherein said electrically conductive connector means further comprises a second electrically conductive connection feature on said second layer in electrical contact with said first mentioned connection feature of said first layer.

12. The circuit board of claim 11 wherein said second connection feature comprises a raised feature integral with said second layer.

13. A method of making a multi-layered circuit board having a dielectric layer with first and second conductive circuit layers on opposite sides thereof interconnected with one another through said dielectric layer, said method comprising the steps of:
   forming a dielectric layer having a hole therethrough,
   forming a first conductive circuit layer having a first raised feature,
   forming a second conductive circuit layer having a second raised feature, wherein said first and said second raised features each comprise a hollow protrusion projecting from said respective conductive circuit layers,
   laminating said first and second layers to opposite sides of said dielectric layer with said first and second raised features extending into said hole from opposite sides thereof, and
   electrically interconnecting said first and second raised features within said hole comprising fusing said first and said second hollow raised features to one another within said hole.

14. The method of claim 13 wherein said step of forming said circuit layer comprises the step of forming an electrically conductive mandrel having a projecting mandrel feature, and integrally electroforming said first layer and said first raised feature on said mandrel and over said mandrel feature.

15. The method of claim 14 wherein said step of laminating said first and second layers comprises laminating at least said first circuit layer to said dielectric layer while said first circuit layer is still on said mandrel, and including the step of removing the mandrel from said first circuit layer.

16. A circuit board made by the method of claim 15.

17. A multi-layered circuit board comprising:
   a dielectric layer having first and second sides and having a hole extending therethrough,
   a first layer of electrically conductive material at said first side and having a first electrically conductive connection feature extending into said hole,
   a second layer of electrically conductive material at said second side of said dielectric layer in electrical contact with said first feature, and
   an electrically conductive epoxy electrically interconnecting said connection feature with said second layer.

18. The circuit board of claim 17 wherein said second layer includes a second electrically conductive connection feature electrically interconnected to said first feature within said hole.

19. A method of forming a printed circuit having first and second conductive layers separated by a dielectric layer, said method comprising the steps of:
   forming a first layer comprising;
     electroplating a first layer of electrically conductive material on a mandrel having an electrically conductive surface and an electrically conductive projecting mandrel feature such that said first layer is deposited over said conductive surface and said projecting mandrel feature to integrally form a raised feature in said first layer, forming a dielectric layer with an aperture for receiving said raised feature, placing a first side of said dielectric layer on said first layer with an end of said raised feature received in said aperture, applying an electrically conductive epoxy to said raised feature, partially curing said applied epoxy, forming a second conductive layer, placing said second layer on the other side of said dielectric layer, and laminating said layers together under pressure and temperature such that said epoxy flows between said raised feature and said second layer and said flowed epoxy cures.

20. The method of claim 19 wherein said mandrel feature is a depression in said mandrel, and wherein said deposited conductive material partially fills said depression such that said raised feature integrally formed in said first layer is hollow, and the step of forming a first conductive layer further comprises the steps of filling said hollow raised feature with a solid material and remove said first layer having said idled raised feature from said mandrel prior to the step of pacing a first side of said dielectric layer.

21. A circuit board made by the method of claim 19.

22. A circuit board made by the method of claim 20.

23. A multi-layer circuit board comprising:

a plurality of dielectric layers each having first and second sides and each having a plurality of holes extending between said first and second sides, electrically conductive layers on both sides of said dielectric layers, each electrically conductive layer having integrally formed electrically conductive raised features extending into respective holes of said dielectric layers to a location adjacent said second side of each side dielectric layer, and an electrically conductive epoxy in said holes for electrically connecting respective electrically conductive layers to each other, said epoxy including a portion thereof extending over and around said raised features.

24. The circuit board of claim 23 wherein some of said raised features are hollow features filled with a solid material to provide rigidity.

* * * * *